(12) United States Patent
Reichenbach et al.

(10) Patent No.: US 7,919,907 B2
(45) Date of Patent: Apr. 5, 2011

(54) CIRCUIT MODULE

(75) Inventors: Ralf Reichenbach, Esslingen (DE); Marian Keck, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 106 days.

(21) Appl. No.: 12/227,734

(22) PCT Filed: Jun. 13, 2007

(86) PCT No.: PCT/EP2007/055807
§ 371 (c)(1),
(2), (4) Date: Apr. 24, 2009

(87) PCT Pub. No.: WO2008/017533
PCT Pub. Date: Feb. 14, 2008

(65) Prior Publication Data
US 2009/0206703 A1    Aug. 20, 2009

(30) Foreign Application Priority Data

Aug. 11, 2006  (DE) .......................... 10 2006 037 693
Feb. 14, 2007  (DE) .......................... 10 2007 006 994

(51) Int. Cl.
*H01L 41/113* (2006.01)
(52) U.S. Cl. .......................... 310/339; 310/329; 310/348
(58) Field of Classification Search ................. 310/329, 310/339, 348
See application file for complete search history.

(56) References Cited

U.S. PATENT DOCUMENTS

| 4,384,482 | A |   | 5/1983 | Snyder |
| 4,972,713 | A | * | 11/1990 | Iwata ............................ 73/654 |
| 5,118,981 | A | * | 6/1992 | Kobayashi et al. ........... 310/329 |
| 7,005,780 | B2 | * | 2/2006 | Sakai ............................ 310/329 |
| 7,078,850 | B2 | * | 7/2006 | Sakai ............................ 310/339 |
| 7,516,659 | B2 | * | 4/2009 | Murelitharan ............. 73/514.01 |
| 7,737,608 | B2 | * | 6/2010 | Ruggeri et al. ............... 310/339 |
| 2005/0017602 | A1 | * | 1/2005 | Arms et al. .................. 310/339 |
| 2008/0136292 | A1 | * | 6/2008 | Thiesen ........................ 310/334 |
| 2009/0211353 | A1 | * | 8/2009 | Gao et al. ..................... 73/146.5 |
| 2009/0284103 | A1 | * | 11/2009 | Lee ............................... 310/329 |

FOREIGN PATENT DOCUMENTS

| WO | WO 2004/030949 | 4/2004 |
| WO | WO 2006/072539 | 7/2006 |
| WO | WO 2007/000781 | 1/2007 |

* cited by examiner

*Primary Examiner* — Thomas M Dougherty
(74) *Attorney, Agent, or Firm* — Kenyon & Kenyon LLP

(57) ABSTRACT

A circuit module, e.g., for use in a vehicle tire, includes a housing, a piezoelectric generator, which has a mass element that is movable within the housing and a spring device, which has at least one piezoelectric element, the mass element and the spring device forming an oscillatory system, and the piezoelectric element being elastically deformable in response to the oscillation of the oscillatory system. A current supply circuit is provided for receiving a piezoelectric voltage output by the piezoelectric element in response to the mechanical deformation thereof and for supplying power to the circuit module.

28 Claims, 2 Drawing Sheets

CIRCUIT MODULE

BACKGROUND OF THE INVENTION

1. Field of the Invention

The present invention relates to a circuit module, in particular a sensor module, which is preferably introducible as a tire sensor module into a vehicle tire, as well as to a vehicle tire having a circuit module of this kind.

2. Description of Related Art

Tire sensors are used, in particular, for measuring the internal tire pressure (tire pressure monitoring system, TPMS), as well as the temperature or the acceleration occurring inside of the tire. For this purpose, the sensor module typically includes a circuit substrate, respectively a substrate, at least one sensor component, and an antenna via which data are transmitted to a transceiver on the vehicle.

For the energy supply, besides electromagnetic wave irradiation, systems having an autonomous, battery- or galvanic cell-based energy supply are known, in particular. However, environmental protection requirements entail high disposal costs, as well as a substantial outlay for separation processes during disassembly. Tire sensor modules having batteries are typically mounted on the tire rim, since the galvanic cells used as batteries must be disposed of separately from the rubber tire material and since they do not tolerate the temperatures that occur inside of the tire during vulcanization. Furthermore, the service life is limited by the capacity of the battery which frequently is not replaceable; since the sensor module is limited in size, the batteries must also not be dimensioned to be too large.

The use of piezoelectric elements for supplying power or energy to autonomous modules is generally not without its problems, since the piezoelectric elements are typically fabricated from brittle ceramics and the flexural stress that occurs in response to deflections can, therefore, lead to destruction. Higher-complexity systems equipped with piezoelements often have larger space requirements which can lead to higher costs and, in some instances, to an unacceptable size when the module is integrated in a vehicle tire.

BRIEF SUMMARY OF THE INVENTION

In accordance with the present invention, a piezoelectric generator is provided as a spring-mass system, which, as a voltage source in the circuit module, renders possible an autonomous energy supply. This makes it possible, in particular, for a tire sensor, for example a tire-pressure monitoring sensor (TPMS), including sensor and radio electronics, to be autonomously supplied with power. Likewise possible are other applications as an autonomous module that is subject to continuous or discontinuous mechanical loads.

The piezoelectric generator has a movable mass element, respectively a seismic mass, which is guided in the housing of the circuit module and cooperates with a spring device that is connected on the housing side.

The present invention provides for the piezoelement to be part of the spring device, it basically also being able to itself constitute the spring device. However, one example embodiment provides for an additional spring element to which the piezoelectric element is affixed in such a way that, in response to the oscillation of the seismic mass, it is deflected by the elastic deformation of the spring device and thereby generates a piezoelectric voltage that is tapped off by its electrodes that are formed on the top and bottom side and is made available via a current-supply circuit to the components of the circuit module.

When a spring-mass system according to the present invention is used, proper dimensioning of the spring constant and the mass will allow a resonant frequency to be selected that will result in a high energy yield.

This is based on the realization according to the present invention that, at low speeds, the greatest accelerations in the tire occur within the frequency range of less than 500 Hz, i.e., a broadband frequency spectrum exists at lower frequencies, in particular. The acceleration values increase with a decrease in the frequency. In response to a broadband excitation, as occurs in a vehicle tire during travel, the piezoelectric generator according to the present invention oscillates at its resonant frequency, so that by properly dimensioning the mass value and the spring constants, high energy yields are possible. In accordance with the present invention, the resonant frequency may at this point be specified for a high, respectively, maximum power output within the range of the highest accelerations; in this case, low natural frequencies may be set, in particular.

The present invention makes it possible for the available installation space to be taken into consideration, thereby allowing the dimensioning and size of the mass, as well as the length, width and thickness of the spring to be adjusted. To obtain low resonant frequencies, the present invention provides, in particular, for the mass and spring length to be maximized, and the spring width and the spring thickness to be minimized.

In accordance with the present invention, the shape of the mass element may be directly adapted to the inner cross section of the housing, so that it is guided through the housing during its oscillatory motion and is limited at one end by the housing and/or the circuit substrate. The mass element thereby optimally fills the available space and is, therefore, maximized. In principle, other means or topologies may be optionally introduced into the housing to guide the mass element as well as to define a limit stop; however, this is basically rendered superfluous by the present invention since the housing is able to directly constitute the guidance and the limit stop.

The spring device is advantageously constituted of a metallic leaf spring that is securely accommodated, e.g., clamped in the housing. In particular, it may be secured in position in a housing groove having elongated end regions and execute an oscillation about these fixing or clamping points. When a metallic leaf spring is used, its mass contact regions may engage on the seismic mass and thereby co-execute its oscillatory motion, and spring regions may produce the elastic spring action. In this connection, in particular, two (or more) spring regions that are adjustable relative to the mass contact surfaces may be accommodated via their end regions in the housing and thus change the angle formed between them in response to the oscillation.

It is especially by mounting the ends of the spring regions within the housing that a reliable, defined oscillation is rendered possible in the context of a substantial variability, respectively capability for setting the spring constants by properly forming these spring regions. In this case, the ends may be held by their top and bottom sides, but lie exposed at their end-face edges, so that the edges do not make contact within the housing at the end-face side during oscillation.

By holding the ends of the spring regions in clamping engagement while allowing for minimal play in accordance with the present invention, in particular without any contact being made at the end-face side, it is possible to obtain a low resonant frequency, in particular lower than in the case of a fixed clamping engagement, for example. In addition, there is no need for any further stable anchoring attachment made of solid materials.

The housing may, in particular, be round in cross section, i.e., essentially cylindrical or lenticular. A high pressure resistance during vulcanization is hereby rendered possible; in addition, the available installation space is effectively utilized by the other components; accordingly, the mass element being cylindrical and guided in the housing, and an essentially round, sheet-metal spring having structurally formed spring regions being provided as a spring device, the spring regions being held in the housing by protruding end regions.

The cylindrical mass fills the entire installation space and thereby achieves a geometric optimum. The mass value may be adjusted as a function of the height, respectively of the axial extent of the cylindrical mass element.

In accordance with the present invention, the brittle ceramic material of the piezoelement is not involved in the clamping engagement or mass coupling and is, therefore, protected from shock and overloading.

The piezoelement may be designed to have a length and dimensions that allow it to undergo a good or even optimal deflection in the case of the configured spring-mass system. In this case, the length of the—essentially strip-type—piezoelement, its width and the points of connection to the spring regions may be selected.

The maximum deflection of the spring-mass system may be limited by the mass, respectively the sheet-metal spring making contact with the housing; the piezoelement remains protected in this case.

Since the sheet-metal spring is highly stable, even given a small material thickness, and the ceramic material of the piezoelement in the spring-mass system does not have a load-bearing role, the material thickness of both elements may be reduced. This leads to lower resonant frequencies.

Since the piezoelement is coupled to the spring device and executes a flexural oscillation, it influences the spring constant of the overall system, accordingly. This is considered in the design.

The piezoelectric element is coated on its top and bottom side with an electrically conductive layer, which is used as a bottom and, respectively, top electrode. For the electrical contacting, on the one hand, the metallic spring device, i.e., in particular a metallic sheet-metal spring may be used and, in this case, contact the bottom electrode. On the other hand, the top electrode formed on the top side of the piezoelectric element may be contacted via another contacting means, for example, a wire, a flexible circuit board or a flexible sheet metal.

Thus, the present invention provides a secure, material-protecting mounting of the piezoelement, and a spring-mass system whose structural design parameters are adaptable within a broad range, in particular also for producing low resonant frequencies given a secure mounting within the housing, given a defined contact making of the mass element.

DETAILED DESCRIPTION OF THE INVENTION

Figure 1A:
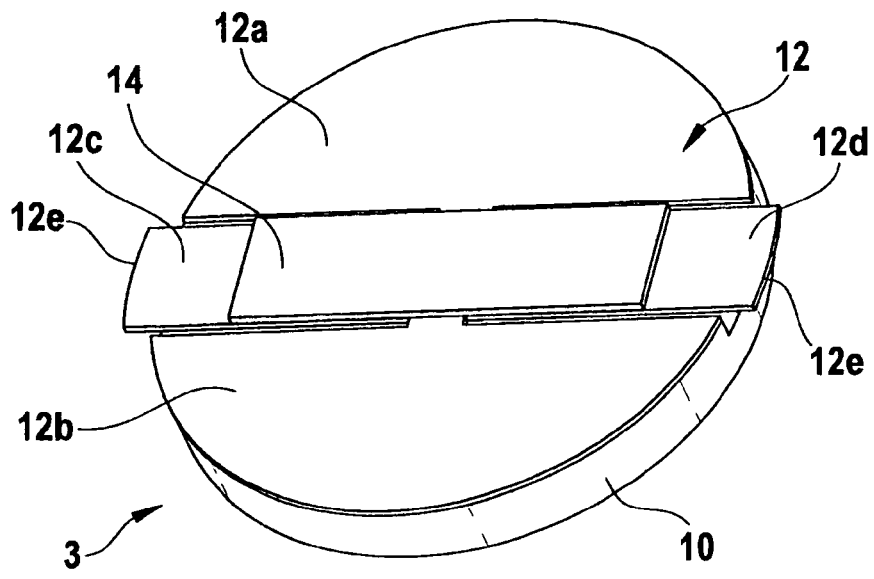
FIG. 1a and FIG. 1b show the piezoelectric generator of the circuit module in a perspective view and exploded view, respectively.
Figure 1B:
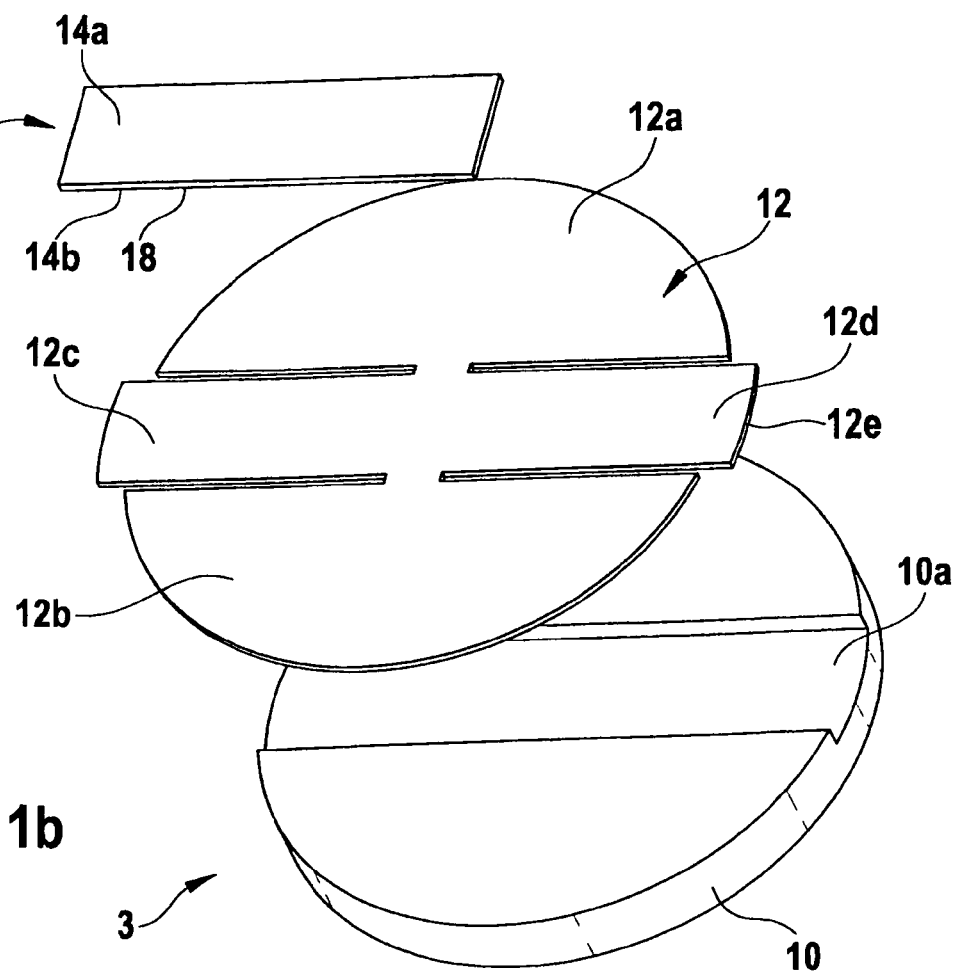
Figure 2:
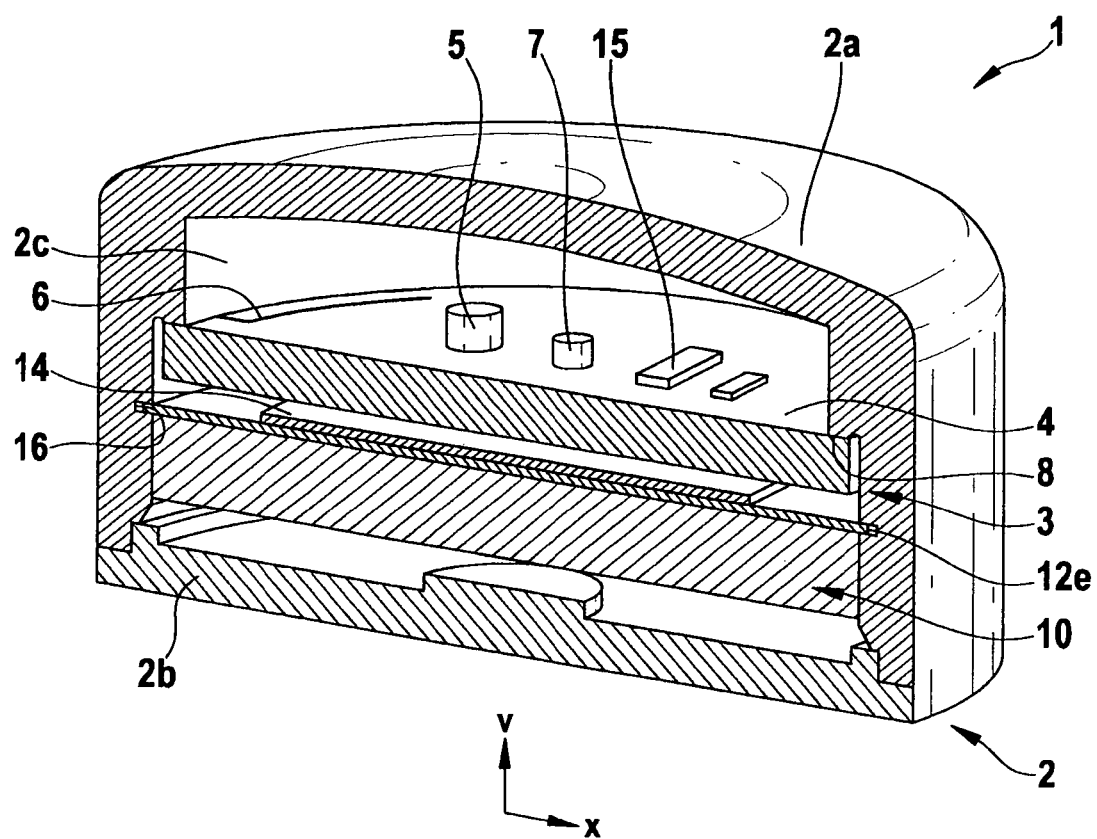
FIG. 2 shows a cross section through a circuit module according to the present invention.

Circuit module 1 shown in cross section in FIG. 2 has a housing 2 having a pot-shaped housing upper part 2a and a lid-shaped or disk-shaped housing lower part 2b and encloses a housing interior space 2c. Accommodated in housing interior space 2c in FIG. 1 a, b are piezoelectric generator (PEG) 3, shown in greater detail, and a circuit substrate 4 including module electronics 5, 7, 15, not shown in detail, of SMD components. Depending on the intended application of circuit module 1, module electronics 5, 7, 15 may have different components. Provided are a current-supply circuit 5 for receiving the piezoelectric voltage and for supplying the supply voltage, advantageously also an energy-storage device for buffering the energy in the case of temporarily intermittent operation. For a use as a tire-pressure monitoring system (TPMS), in addition a pressure sensor 7 and, as components 15, a control unit, for example an ASIC, and for the operation of the antenna, relevant high-frequency components, for example an oscillator and, optionally, a high-frequency ASIC, are mounted on circuit substrate 4 designed as a circuit board, for example. Antenna 6 indicated in FIG. 2 may be configured circumferentially as a loop antenna, for example, on the outer rim of circuit substrate 4; in principle, however, antenna 6 may also extend in or on housing 2, for example, on the inner wall of housing 2 or also be injection-molded into housing 2. However, when the application calls for a tire-pressure monitoring system, housing 2 has an orifice used as an external pressure feed.

Housing 2 and circuit substrate 4 advantageously have an at least substantially rotationally symmetric or round shape, so that, when injected-molded as a tire-sensor module into the rubber material of a tire, circuit module 1 is not subject to any undesirable orientation, does not have any undesirable corners or edges, and has a rotationally symmetric radiation pattern of its antenna 6.

In housing 2, an edge or a recess 8 may be formed, on which circuit substrate 4 rests or is accommodated in such a way that module electronics 5, 7, 15 located on top side thereof shown in FIG. 2 are able to project freely upwardly into housing interior space 2c without abutting on housing 2; they are also not affected by piezoelectric generator 3 provided underneath circuit substrate 4.

In accordance with FIGS. 1a, b, piezoelectric generator 3 has a mass element 10 which is accommodated in a manner that permits movement or adjustment in housing interior space 2c, a metallic spring element 12 and a piezoelectric element 14. In this specific embodiment, piezoelectric element 14 is designed as a strip-type monolayer of a piezoelectric ceramic; metallic spring element 12 is essentially designed as a leaf spring and has mass contact regions 12a, b shown in the upper and lower portions of FIGS. 1a, b that rest with their bottom side on mass element 10. Located therebetween are elastic spring regions 12c, d, which are adjustable relative to the mass contact regions. In this case, a correspondingly wide groove 10a or recess may be formed in mass element 10 beneath spring regions 12c, d to allow spring regions 12c, d to slip into the same when the mass element presses upwardly against mass contact regions 10a, b.

Spring regions 12c, d have radially outwardly extending, protruding outer end regions 12e, which, in accordance with FIG. 2, are inserted, preferably clamped in housing grooves 16 of housing upper part 2a. In principle, end regions 12e may be clamped at the end faces on the groove base of housing groove 16. However, end regions 12e are advantageously not clamped at the end faces, respectively, do not contact the groove base by the end face edges thereof, in order to permit an oscillatory motion of spring regions 12c, d during which the distance between two end regions 12e changes; thus, essentially, a clamping is provided at the top and bottom side of end regions 12e, while allowing for a free oscillatory motion. A lower resonent frequency is made possible by the mounting at the top and bottom side, instead of the end-face clamping.

On its top side 14a, strip-type piezoelectric element 14 has a metallic layer used as a top electrode and, on its bottom side 14b, a metallic layer used as a bottom electrode; thus, top side 14a and bottom side 14b are used directly as top electrode 14a, respectively, as bottom electrode 14b. In this case, piezoelectric element 14 rests on both spring regions 12c, d and, on its bottom side 14b, respectively bottom electrode 14b, is electroconductively fixed thereto in a bonding layer 18, for example of conductive adhesive or solder, which is also used for tapping off piezoelectric voltage Up. In accordance with FIG. 2, top side 14a, respectively top electrode 14a may be directly contacted on the bottom side of circuit substrate 4, for example by way of a laid-on wire, corresponding contact pads, respectively metallic surface regions of circuit substrate 4 or an inserted flexible sheet metal.

Mass element 10 advantageously fills the entire cross section of housing interior space 2a, i.e., it is essentially designed as a cylindrical disk. Two advantages are thereby derived: On the one hand, a large mass may be achieved and thus low resonant frequencies, respectively low-frequency natural oscillations; on the other hand, mass element 10 is hereby guided on the inner walls of housing 2, so that it is not able to tilt laterally and a uniform oscillatory motion is thereby ensured.

Accordingly, metallic spring element 12 is also advantageously adapted in its shape to the cross section of housing interior space 2c, i.e., in accordance with the illustrated specific embodiment, is designed to be round or disk-shaped, end regions 12e protruding radially in order to be held in housing grooves 16. Circuit substrate 4 is also advantageously designed to be round or cylindrical, so that it rests securely against the inner walls of housing 2 and utilizes the available surface area.

In principle, designs of housing 2 and of elements 4, 12 and 10 accommodated therein that deviate from the round shape, for example a somewhat elliptical or oval shape are also possible; however, in that case, antenna 6 should be designed as an essentially circular, closed loop antenna, in order to ensure a homogeneous radiation pattern.

In response to a mechanical load produced, in particular, by accelerations or vibrations in vertical (axial) direction V, i.e., in the stack direction of the illustrated configuration, respectively of the axis of symmetry of the cylindrical housing form, at this point, mass element 10 is able to execute an oscillation in the lower region of housing interior space 2c in FIG. 2 that is downwardly limited by housing bottom portion (housing bottom) 2b and upwardly limited by spring element 12. Thus, spring element 12 held in the mount in housing interior space 2c functions as a travel limitation, respectively as a limit stop for the oscillatory motion of mass element 10. The limit-stop distance is defined by the distance of spring element 12 from mass element 10, thus by the depth of mass groove 10a.

In response to the oscillation of mass element 10, spring regions 12c, d are forced out of the horizontal X plane of mass contact regions 12a, b and rebound again. Accordingly, the piezoelectric element affixed thereto executes a flexural oscillation and generates a piezoelectric voltage Up between its top side 14a and its bottom side 14b that varies over time and generally changes its operational sign.

The spring constant of the piezoelectric generator of FIGS. 1, 2 is determined by the spring constant of spring regions 12c, d and also by piezoelectric element 14, which is affixed to spring regions 12c, d and which has a stiffening effect. The spring constant of spring regions 12c, d may be set, in particular, by properly forming spring regions 12c, d. Thus, by properly selecting mass m of mass element 10, as well as the spring constants of the entire spring device, made up of spring element 12 and piezoelectric element 14, it is possible to select the natural frequency. Resonant frequencies within the range of 10 to 600 Hz, preferably of 300 to 500 Hz, are preferably selected.

The radial diameter of circuit module 1 shown in FIG. 2 is preferably between 15 and 5 mm, in particular, it is smaller than 25 mm. The height is advantageously somewhat smaller.

Since in the case of piezoelectric ceramics, compressive stresses many times higher than tensile stresses are permissible, the limit stops of the spring-mass system may also be designed to allow a greater deflection of the piezoelement in the compression direction than in the expansion direction. In the case of the coordinate system illustrated in FIG. 2, the compression direction extends oppositely to V; the expansion direction in parallel to V. In a rolling tire, the piezoelectric generator in installed, in particular, in such a way that the occurring radial acceleration always deflects the spring-mass system including components 10, 12 and 14 in the compression direction of the piezoelement. The system is able to oscillate symmetrically about this position in response to vibrations occurring due to road irregularities, for example. Thus, the operating point of the generator is defined by a deflection that is offset relative to the neutral position, and it varies in response to the angular velocity of the tire. This performance characteristic may be utilized for any desired bendable bar designs, particularly for bendable bars clamped on one side, as well.

To reliably prevent a mechanical overloading in the tensile-stress direction of the piezoelement, the limit stop between the spring element and mass element may be designed in such a way that, in its neutral position, the spring rests against the mass element; i.e., no recessed groove is provided in the mass element. This means that the recessed groove 10a in FIG. 1b may also be omitted.

In comparison to symmetrically selected limit stops, this special design of the limit stops of the spring-mass system makes it possible to produce a markedly higher electrical energy, in particular in a rolling tire. At the same time, an enhanced reliability of mechanical operation is achieved.

The limit stops of the spring-mass system for limiting the maximum deflection may be implemented on both sides by the module housing. In this case, there are stringent requirements on the manufacturing tolerances, particularly in the deflection direction in which the piezoelement is subject to expansion stress. This deflection may be alternatively or additionally limited by mass element 10 making contact with spring device 12. To render possible an additional deflection in this direction, a recessed groove 10a may be provided in the mass element. The groove depth determines the permissible path displacement. In the case of tire sensor modules in particular, the need for the recessed groove may be eliminated due to the prevailing radial acceleration and in order to improve reliability.

Generally, when executing its oscillatory motion, mass element 10 may be limited by one limit stop on each of both sides. In this context, it is possible that the two distances between the mass element in its neutral position and the limit stops differ or even that there is no distance between one of the limit stops and the mass element in its neutral position. The limit stop which, in its neutral position, is not spaced at a distance from the mass element, may, for example, be a question of the leaf spring region, respectively elastic spring region 12c, d for making contact with mass element 10.

The circuit module may be mounted in or on a vehicle tire in such a way that the vertical axis direction of housing (V) coincides with the radial direction of the tire, mass element 10 being positioned radially further out than piezoelectric element 14. The mass element is then deflected radially relative to the tire due to the radial acceleration caused by the rolling motion of the tire.

It is also possible for the circuit module to be mounted on or in a vehicle tire in such a way that the vertical axis direction of housing (V) coincides with the axial or tangential direction of the tire.

In the exemplary embodiment, the described piezoelectric generator for tire-sensor modules converts the radial accelerations occurring in the tire into electrical energy. In principle, however, it is also possible for axially or tangentially occurring vibrations to be converted.

What is claimed is:

1. A circuit module configured for use in a vehicle tire, comprising:
   a housing;
   a piezoelectric generator including:
      a spring device, including an interconnected spring element and piezoelectric element; and
      a mass element, the mass element being configured to be movable within the housing; and
   a current-supply circuit configured for receiving a piezoelectric voltage output by the piezoelectric element in response to a mechanical deformation of the piezoelectric element and for supplying power to the circuit module;
   wherein:
      the mass element and the spring device form an oscillatory system, the piezoelectric element being elastically deformable in response to an oscillation of the oscillatory system;
      the spring element:
         is secured in the housing; and
         includes:
            end regions which are clamped in the housing;
            at least one mass contact region for making contact with the mass element; and
            two tongue-like, radially outwardly protruding, elastic spring regions; and
      the piezoelectric element:
         is affixed to the two elastic spring regions for executing a flexural oscillation; and
         executes a bending action in response to an elastic deformation of at least one of the two elastic spring regions.

2. The circuit module as recited in claim 1, wherein end-face edges of the end regions lie exposed in at least one housing groove of the housing, and a distance between the end-face edges of the end regions are adjustable during an oscillatory motion.

3. The circuit module as recited in claim 1, wherein the piezoelectric element has an elongated strip shape which extends orthogonally to the vertical axis of the housing.

4. The circuit module as recited in claim 1, wherein the current-supply circuit has an energy storage device for buffering the energy produced by the piezoelectric element.

5. The circuit module as recited in claim 1, wherein the piezoelectric element is the only energy source of the circuit module, and wherein the circuit module is free of self-consuming energy sources.

6. The circuit module as recited in claim 1, further comprising:
   a sensor configured for measuring at least one of pressure, temperature and acceleration.

7. The circuit module as recited in claim 1, wherein the oscillatory system has a natural frequency of 10 to 600 Hz.

8. The circuit module as recited in claim 1, wherein the circuit module is positioned in the vehicle tire, the circuit module being one of: a) vulcanized into the rubber material of the vehicle tire; b) bonded into the rubber material of the vehicle tire; c) held in a pocket of the vehicle tire; or d) clamped in a pocket of the vehicle tire.

9. The circuit module as recited in claim 1, wherein the circuit module is one of mounted on or in the vehicle tire in such a way that the vertical axis of the housing coincides with the radial direction of the tire, and wherein the mass element is positioned radially further out than the piezoelectric element.

10. A circuit module configured for use in a vehicle tire, comprising:
    a housing;
    a piezoelectric generator including:
       a spring device, including an interconnected spring element and piezoelectric element; and
       a mass element, the mass element being configured to be movable within the housing; and
    a current-supply circuit configured for receiving a piezoelectric voltage output by the piezoelectric element in response to a mechanical deformation of the piezoelectric element and for supplying power to the circuit module;
    wherein:
       the mass element and the spring device form an oscillatory system, the piezoelectric element being elastically deformable in response to an oscillation of the oscillatory system;
       the mass element is guided during an oscillatory motion on an inner wall of the housing;
       the spring element:
          is secured in the housing; and
          includes:
             end regions which are clamped in the housing;
             at least one mass contact region for making contact with the mass element; and
             at least one elastic spring region for elastic deformation; and
       the piezoelectric element is affixed to the at least one elastic spring region and, in response to an elastic deformation of the elastic spring region, executes a bending action.

11. The circuit module as recited in claim 10, wherein end-face edges of the end regions lie exposed in at least one housing groove of the housing, and a distance between the end-face edges of the end regions are adjustable during an oscillatory motion.

12. The circuit module as recited in claim 10, wherein the piezoelectric element has an elongated strip shape which extends orthogonally to the vertical axis of the housing.

13. The circuit module as recited in claim 10, wherein the current-supply circuit has an energy storage device for buffering the energy produced by the piezoelectric element.

14. The circuit module as recited in claim 10, wherein the piezoelectric element is the only energy source of the circuit module, and wherein the circuit module is free of self-consuming energy sources.

15. The circuit module as recited in claim 10, further comprising:
    a sensor configured for measuring at least one of pressure, temperature and acceleration.

16. The circuit module as recited in claim 10, wherein the oscillatory system has a natural frequency of 10 to 600 Hz.

17. The circuit module as recited in claim 10, wherein the mass element is limited by one limit stop on each side during the oscillatory motion.

18. The circuit module as recited in claim 17, wherein a first distance between the mass element in a neutral position and a first limit stop differs from a second distance between the mass element in the neutral position and a second limit stop.

19. The circuit module as recited in claim 18, wherein one of the first distance and the second distance is substantially zero.

20. The circuit module as recited in claim 19, wherein the limit stop positioned at a substantially zero distance from the mass element is formed by the at least one elastic spring region.

21. The circuit module as recited in claim 10, wherein the circuit module is positioned in the vehicle tire, the circuit module being one of: a) vulcanized into the rubber material of the vehicle tire; b) bonded into the rubber material of the vehicle tire; c) held in a pocket of the vehicle tire; or d) clamped in a pocket of the vehicle tire.

22. The circuit module as recited in claim 10, wherein the circuit module is one of mounted on or in the vehicle tire in such a way that the vertical axis of the housing coincides with the radial direction of the tire, and wherein the mass element is positioned radially further out than the piezoelectric element.

23. The circuit module as recited in claim 18, wherein the circuit module is one of mounted on or in the vehicle tire, and wherein the mass element is deflected radially relative to the tire due to a radial acceleration caused by a rolling motion of the tire.

24. The circuit module as recited in claim 18, wherein the circuit module is one of mounted on or in the vehicle tire in such a way that the vertical axis of the housing coincides with one of the axial or tangential direction of the tire.

25. A circuit module configured for use in a vehicle tire, comprising:
   a housing;
   a piezoelectric generator including:
      a spring device, including an interconnected spring element and piezoelectric element; and
      a mass element, the mass element being configured to be movable within the housing; and
   a current-supply circuit configured for receiving a piezoelectric voltage output by the piezoelectric element in response to a mechanical deformation of the piezoelectric element and for supplying power to the circuit module;
   wherein:
      the mass element and the spring device:
         substantially fill at least one cross-section of interior space of the housing; and
         form an oscillatory system, the piezoelectric element being elastically deformable in response to an oscillation of the oscillatory system;
      the spring element:
         is secured in the housing; and
         includes:
            end regions which are clamped in the housing;
            at least one mass contact region for making contact with the mass element; and
            at least one elastic spring region for elastic deformation; and
      the piezoelectric element is affixed to the at least one elastic spring region and, in response to an elastic deformation of the elastic spring region, executes a bending action.

26. The circuit module as recited in claim 25, wherein a circuit substrate for the current-supply circuit and at least one further component is accommodated in the housing interior space.

27. The circuit module as recited in claim 26, wherein the circuit substrate, the piezoelectric element, the spring element and the mass element are stacked in the housing in descending order from top to bottom.

28. The circuit module as recited in claim 27, wherein an electrode on a bottom side of the piezoelectric element is electrically connected to the spring element, and wherein an electrode on a top side of the piezoelectric element is electrically connected to the circuit substrate.

* * * * *